(12) United States Patent
Posseme et al.

(10) Patent No.: US 9,698,250 B2
(45) Date of Patent: Jul. 4, 2017

(54) METHOD FOR THE SURFACE ETCHING OF A THREE-DIMENSIONAL STRUCTURE

(71) Applicant: Commissariat a L'Energie Atomique et aux Energies Alternatives, Paris (FR)

(72) Inventors: Nicolas Posseme, Grenoble (FR); Christian Arvet, Bernin (FR); Sebastien Barnola, Villard Bonnot (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 4 days.

(21) Appl. No.: 14/855,807

(22) Filed: Sep. 16, 2015

(65) Prior Publication Data

US 2016/0079396 A1 Mar. 17, 2016

(30) Foreign Application Priority Data

Sep. 17, 2014 (FR) ...................................... 14 58758

(51) Int. Cl.

| H01L 27/12 | (2006.01) |
|---|---|
| H01L 29/66 | (2006.01) |
| H01L 21/265 | (2006.01) |
| H01L 21/311 | (2006.01) |
| H01L 29/06 | (2006.01) |
| H01L 29/78 | (2006.01) |

(52) U.S. Cl.
CPC .... *H01L 29/66795* (2013.01); *H01L 21/2658* (2013.01); *H01L 21/31111* (2013.01); *H01L 21/31116* (2013.01); *H01L 29/0649* (2013.01); *H01L 29/785* (2013.01)

(58) Field of Classification Search
CPC ......... H01L 29/66795; H01L 21/31116; H01L 21/31111; H01L 29/785
See application file for complete search history.

(56) References Cited

U.S. PATENT DOCUMENTS

| 7,476,578 B1 | 1/2009 | Cheng et al. |
|---|---|---|
| 2011/0021027 A1 | 1/2011 | Johnson |
| 2014/0080276 A1 | 3/2014 | Brand et al. |
| 2014/0239401 A1 | 8/2014 | Basker et al. |

(Continued)

OTHER PUBLICATIONS

French Preliminary Search Report issued May 5, 2015 in French Application 14 58758, filed on Sep. 17, 2014 (with English Translation of Categories of Cited Documents and Written Opinion).

(Continued)

*Primary Examiner* — Elias M Ullah
(74) *Attorney, Agent, or Firm* — Oblon, McClelland, Maier & Neustadt, L.L.P.

(57) ABSTRACT

A method for etching a dielectric layer located on the surface of a three-dimensional structure formed on a face of a substrate oriented along a plane of a substrate, which includes a step of implanting ions so as to directionally create a top layer in the dielectric layer. Such top layer is thus not formed everywhere. Then, the layer in question is removed, except on the predefined zones, such as flanks of a transistor gate. A selective etching of the dielectric layer is executed relative to the material of the residual part of the top layer and relative to the material of the face of the substrate.

18 Claims, 3 Drawing Sheets

(56) References Cited

U.S. PATENT DOCUMENTS

2014/0239420 A1    8/2014  Basker et al.

OTHER PUBLICATIONS

Nathan Marchack et al. "Perspectives in Nanoscale Plasma Etching: What are the Ultimate Limits?", Journal of Physics D: Applied Physics, vol. 44, Apr. 14, 2011, 12 pages.
S. Barnola et al. "Plasma Etching & Integration Challenges Using Alternative Patterning Techniques for 11 nm Node & Beyond", SPIE Advanced Lithography, International Society for Optics and Photonics, 2014, 2 pages.
V. Deshpande et al. "Scaling of Trigate Nanowire (NW) MOSFETs Down to 5 nm Width: 300 K Transition to Single Electron Transistor, Challenges and Opportunities", Solid-State Device Research Conference (ESSDERC), 2012 Proceedings of the European IEEE, 2012, 4 pages.

METHOD FOR THE SURFACE ETCHING OF A THREE-DIMENSIONAL STRUCTURE

TECHNICAL FIELD OF THE INVENTION

The present invention generally relates to the etching of microelectronic, specifically three-dimensional (3D) structures, and more particularly the production of spacers for so-called FinFET type transistor gates, i.e. field effect (FET) transistors, the conduction channel of which comprises a thin vertical lamella made of a semi-conductor material called a <<Fin>>.

STATE OF THE ART

The relentless race for a reduction in the dimensions that characterizes the whole microelectronics industry could be achieved only with the constant improvement of key innovations throughout decades of development since the first integrated circuits were produced industrially in the sixties. Whereas the first integrated circuits comprised only one hundred of transistors, the most recent ones may integrate up to several billions thereof, for the most engineered ones, and specifically the processors used in all kinds of computer devices: servers, computers, tablets, or Smartphones, etc.

Among the techniques developed by the micro-electronic industry to accompany such growth which still follows so-called MOORE's law, i.e. doubling integration every two years, the industrial development and use, from the seventies on, of a so-called dry etching, using gaseous plasma formed in a confined environment, i.e. an etching chamber, significantly participated in such evolution. Mainly used for removing layers of photosensitive resins not developed upon completion of the steps of lithography, plasma etching has gradually been introduced for etching functional layers proper.

Such type of etching made it possible to successfully accompany all the developments of the field effect (FET) transistors having a metal-oxide-semi-conductor (MOS) structure, used by almost all integrated circuits, toward the present, most widely used technique which consists in manufacturing the integrated circuits from complex substrates of the silicon on insulator type, designated by their acronym SOI. The complex substrate, SOI, is characterized by the presence of a thin semi-conducting top layer, generally single-crystal silicon, resting on a continuous layer of oxide, also called buried oxide or BOX. The mechanical solidity and rigidity of the assembly are provided by a thick underlying layer composing the body of the SOI substrate, also defined as <<bulk>> so as to indicate that the starting substrate is generally made of solid silicon.

Such flat structure is very advantageous for the subsequent production of high-performance MOSFET transistors. It should be noted that the thickness and doping of the top semi-conductor layer can easily be checked. It shall then be very advantageous, for the performances of the MOSFET transistors, that the channels thereof, which are provided in such thin layer, can be free of carriers, i.e. <<fully depleted>>, or FD, the acronym used for indicating such state. Such type of transistors which is produced from SOI substrates is called FDSOI. Plasma etching makes it possible to obtain such a structure. It is specifically indispensable to produce, without any lithographic operation, essential elements such as the spacers, positioned on either side of the control gate. These make it possible to define, through self-alignment on the gates of the other two electrodes of a MOSFET transistor, i.e. source and drain. For this purpose, a unique characteristic of plasma etching is used, i.e. the setting thereof so that it can be highly anisotropic, which makes it possible to leave the spacers in place on the flanks of the gate patterns, while simultaneously etching all the surfaces parallel to the plane of the substrate.

Although the briefly described technology above could be used up to the 22 nm (nanometer=10-9 meter) technological node, which is currently used for the most advanced products, a problem rises as regards the production, on an industrial scale, of the future technological nodes, with the next one being, according to MOORE's law, a 15 nm node. As regards the technological nodes beyond the 22 nm one, the micro-electronic industry must face many challenges and turns toward using 3D structures for the manufacturing of transistors, since the present flat so-called FDSOI structure, described above, does not make it possible to reach the desired performances any longer. A so-called FinFET transistor is more specifically considered. As shown in FIG. 1A, in such three-dimensional structure 100, the conduction channel 110 then comprises a thin vertical lamella (along direction 190) made of a semi-conductor material, typically silicon or germanium, called a <<fin>>. It is surrounded, on three sides, by the control gate 130 typically made, as currently, of polycrystalline silicon and also comprising a high permittivity, so-called <<high-k>>, dielectric layer 120. This makes it possible to obtain transistors with higher electrical performances and thus to reduce the leakage currents. The above structure can also have been produced, as above, from a SOI substrate which the BOX layer 104 and the substrate body 102 can be found. A surface layer above such stacking, and for example made of a semi-conductor material such as nano-crystalline silicon, is visible on the face of the substrate (such generally very thin layer is not shown in the figures). The presence of a hard mask 150 at the top of the gate used for forming the gate, and shown in FIG. 1B should also be noted.

The FinFET structure 100 still requires spacers 140 to be provided on either side of the gate 130, as before. As illustrated in FIG. 1B, after depositing, on the whole surface of the devices, a uniform layer of a dielectric material the spacers are made of, it must be possible to obtain, by etching, that spacers 140 perpendicular to the plane of the substrate only remain in place on either side of the gate, as shown. All the other surfaces, more particularly those covering the vertical lamella or <<fin>> 110, whether perpendicular or parallel to the plane of the substrate, must be completely etched. This must be executed without leaving wastes 160 and without damaging 180 the etched surfaces. Besides, it is important to obtain a perfectly anisotropic etching in the corners, while avoiding forming feet 170.

Although plasma etching could be adapted and made it possible to follow the reductions in the size of the patterns upon each introduction of a new technological node in the past, the implementation thereof raises always more numerous problems when size is reduced, more particularly from and beyond the 22 nm technological node. The three-dimensional (3D) characteristic of the FinFET structure results in the fact that the problems already met with a flat FDSOI structure are even more acute. Besides, specific problems arise. More particularly, as seen above in FIG. 1B, the making of spacers faces a major difficulty in that the very anisotropic directional characteristic of plasma etching is no longer sufficient when the spacers of a 3D structure such as that of an FinFET have to be etched. As a matter of fact, during the same etching, the parts perpendicular to the plane of the substrate, located on either side of the gate, which will compose the spacers 140, should be preserved, on the one hand, and the parts perpendicular to the plane of the substrate, located on either side of the <<fin>> should be simultaneously etched. Such demands are clearly incompatible.

Besides a method for producing FinFET transistors wherein a selective etching is executed by forming, via an implantation, an etching-resistant layer is known from document US-A1-2014/0080276. The executed implantation covers all the vertical layers of the transistor, and offers selectivity during a subsequent step of etching. The selective etching thus proposed is not optimum however on the dielectric surfaces outside the spacers.

The object of the invention is thus to describe a method for etching which at least partially solves the above-mentioned problems and which makes it possible to produce, in a particular case, the spacers of the FinFET type transistors gates.

The other objects, characteristics and advantages of the present invention will appear upon reading the following description and referring to the appended drawings. It should be understood that other advantages can be incorporated herein.

SUMMARY OF THE INVENTION

According to one aspect of the invention, a method for etching a dielectric layer located on the surface of a three-dimensional structure formed on a face of a substrate oriented along a plane of a substrate, with said structure comprising surfaces perpendicular to the plane of the face of the substrate and surfaces parallel to the plane of the substrate, with the perpendicular surfaces comprising first plane perpendicular surfaces directed along a first orientation and second plane perpendicular surfaces directed along a second orientation different from the first orientation is described.

Such method advantageously comprises the following successive steps:
  forming a top layer covering the parallel surfaces and the first perpendicular surfaces by ionic implantation of at least one ion species into only a part of the thickness of the dielectric layer, with said implantation being so configured that the top layer does not cover the second perpendicular surfaces;
  partial removing of the top layer so configured as to totally remove the top layer on the parallel surfaces while keeping a residual part of the top layer on the first perpendicular surfaces;
  selective etching of the dielectric layer relative to the material of the residual part of the top layer and relative to the material of the face of the substrate.

The invention thus makes it possible to etch a layer on the surface of a substrate comprising a structure which may be geometrically complex, with such etching being significantly selective so as to remove the dielectric layer at some places and to efficiently keep same at other places, without affecting the underlying layers.

As compared to the known prior art, one effect thereof is an enhanced mastership of the selective etching of the dielectric layer. As a matter of fact, the surface of the spacer is the only one to remain covered with the top layer prior to such etching, with the other surfaces advantageously exposing the dielectric material to etching. Two materials only are thus concerned by etching, so that selectivity can be more efficiently adjusted than when three materials or more are used. In other aspects, the fact that the implantation into the thickness of the dielectric layer is only partial makes it possible to reach such goal.

Another aspect of the invention is a micro-electronic device obtained using the method of the invention.

Another aspect relates to a micro-electronic device comprising a substrate and, on a face of the substrate, a FinFET type transistor comprising:
  a gate located above a surface layer of the face of the substrate, with the surface layer being made of a semi-conductor material, with the gate comprising two parallel flanks perpendicular to a plane of the substrate,
  a channel having two fins, with each one being located on a different flank of the gate,
  on each flank, around the fin, a spacer formed with a dielectric layer,
  characterized in that the spacers comprise a top layer, above the dielectric layer, with the top layer being a layer of the material of the dielectric layer, wherein ions of at least one ion species are implanted.

Oxygen may be selected to be one of the or the only ion species to be implanted.

BRIEF DESCRIPTION OF THE FIGURES

The aims, objects, characteristics and advantages of the invention will be more easily understood upon reading the detailed description of an embodiment of the latter which is illustrated by the following appended drawings, wherein.

Figure 1A:
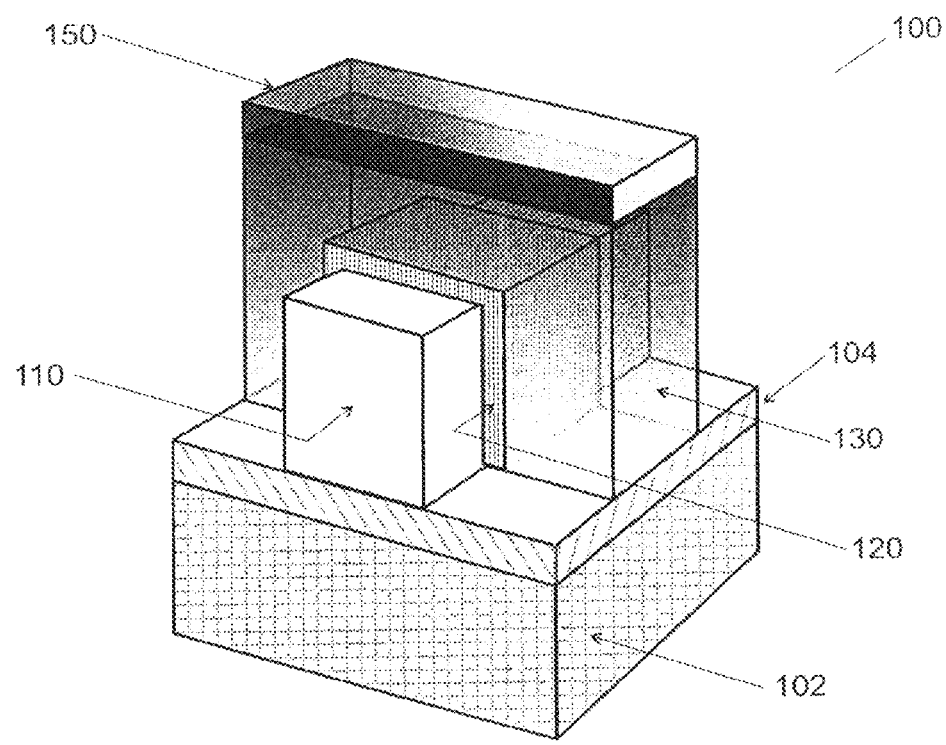
FIGS. 1A and 1B show a 3D structure of a FinFET type transistor and more particularly show the gate spacers which have to be formed.

The drawings attached are given as examples and are not limiting to the invention. Such drawings are schematic representations and are not necessarily to scale with a practical application. More particularly, the relative thickness of the various layers and substrates are not necessarily a representation of reality.

DETAILED DESCRIPTION OF THE INVENTION

Prior to going into details relative to the embodiments of the invention, and more particularly while referring to the drawings, non restrictive characteristics that may be provided by the invention, whether individually or in combination are listed hereafter:
  the implantation is so configured as to oxidize the material of the dielectric layer;
  at least dioxygen is used as the ion species to be implanted;
  the partial removing of the top layer is executed using plasma etching;
  the etching of the partial removing of the top layer is an anisotropic etching so configured as to attack the top layer on the parallel surfaces while not attacking or less attacking the top layer on the first perpendicular surfaces;
  the anisotropic etching is executed using argon or carbon tetrafluoride plasma;
  the selective etching uses plasma;

the anisotropic etching and then the selective etching are executed in the same reactor;

the selective etching is a wet etching;

the dielectric layer (231) is made of a nitride, preferably silicon nitride layer;

the dielectric layer (231) is made of a low-k material having a dielectric constant smaller than that of silicon nitride;

the dielectric layer is conformably deposited onto the face of the substrate and the structure;

the implantation is so configured as to form a top layer with a thickness smaller than half the thickness of the deposited dielectric layer;

the implantation is so configured as to form a top layer with a thickness ranging from 2 to 3 nm;

the residual parts are used as spacers on the flanks of a FinFET type transistor gate;

the face of the substrate comprises a surface layer made of a semi-conductor material;

the first orientation and the second orientation are perpendicular.

It should be noted that, within the scope of the present invention, the words "on", "over" or "underlying" or the equivalents thereof do not necessarily mean "in contact with". Thus, for instance, depositing a first layer on a second layer does not necessarily mean that the two layers are directly in contact with each other, but this means that the first layer at least partially covers the second layer by being either directly in contact therewith or by being separated therefrom by another layer or another element.

In the following description, thickness is generally measured in directions perpendicular to the plane of the lower face of the layer to be etched or of a substrate whereon the lower layer has been deposited. Thickness is thus generally measured along a vertical direction in the figures shown. On the contrary, the thickness of a layer covering a flank of a pattern is measured along a direction perpendicular to such flank.

In the following, selective etching means removing, using etching, a given material while at least partially keeping other materials, thanks to the selectivity of the method used.

"Top layer" means a layer which is formed, more particularly by modifying the underlying layer, on the surface of the electronic device after forming the underlying layer. Then it is partially removed to partially expose the underlying layer. "Top" does not necessarily mean that the residual top layer still remains on the surface of the device when completing the production of the latter. For instance, it may be removed or covered.

"Conformably" means layer geometry having the same thickness, within the production tolerances, an identical thickness in spite of the changes in the direction of the layer, for instance on the flanks of the gate pattern.

"Dielectric" means a material the electric conductivity of which is low enough, in the given application, to be used as an insulator.

The present invention is particularly adapted to the selective etching of micro-electronic devices (inclusive of nanotechnologies) which comprise a complex relief surface, called 3D here. The invention can more particularly be used for devices having substrates, one face at least of which is oriented along a plane and having, on the face of the substrate, one or more relief (and advantageously raised) patterns including flat surfaces, some of which extend along a first plane, preferably perpendicular to the face of the substrate, and for other ones along a second plane, preferably perpendicular to the first plane and to the face of the substrate. The pattern also preferably includes flat surfaces parallel to the face of the substrate and overhanging the other surfaces of the pattern. This configuration can typically be found in FinFET transistors gate and conduction channel. "Flat", "perpendicular" and "parallel" mean here within the production tolerances.

The following description illustrates the invention applied to the production of spacers for FinFET transistor gates. It may be transposed to other applications wherein the geometry of the 3D structures is similar.

In the application to FinFET transistors, and in addition to the surface of the face of the substrate, the parallel surfaces 246 comprise the top of the 3D structure, on the upper face of the fins and on the upper face of the gate 130. This corresponds to the x,y plane of FIG. 2C. The perpendicular surfaces include the sides 242 of the fins (corresponding to the second perpendicular surfaces along the y,z plane and the flanks 244 zones on the gate 130 (corresponding to the first perpendicular surfaces along the x, z plane).

Figure 1B:
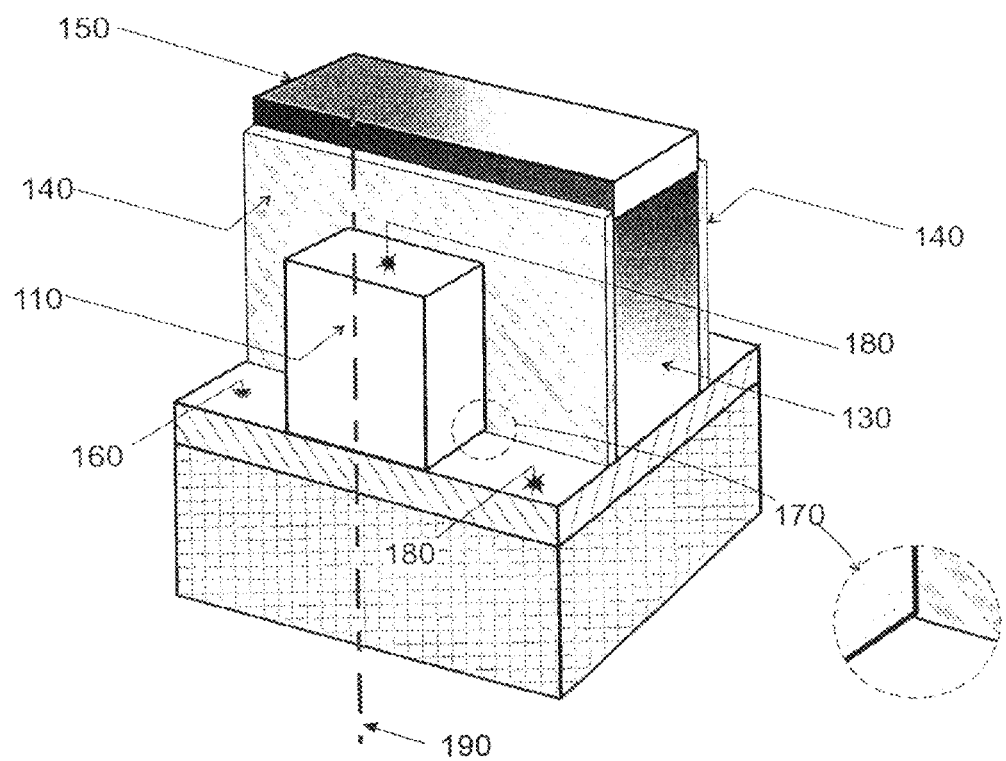

The general structure of the FinFET transistors described while referring to FIGS. 1A and 1B may be unrestrictedly used in the present invention.

Figure 2A:
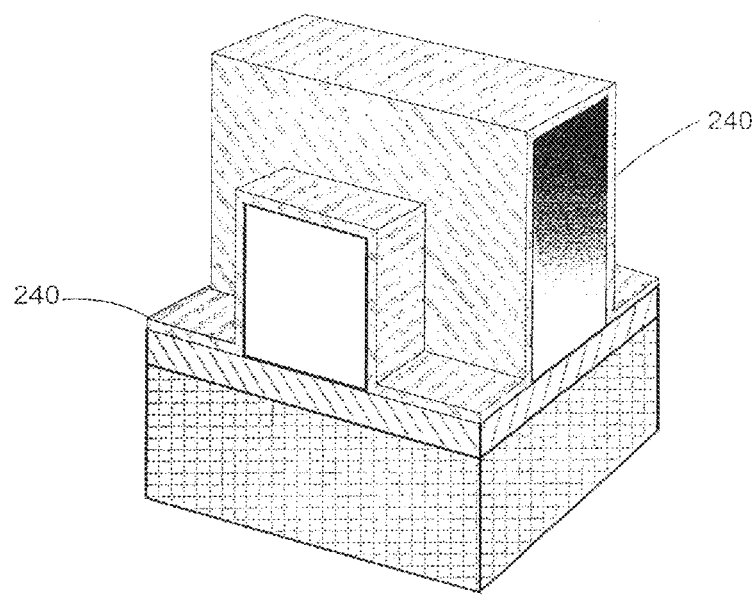
FIGS. 2A to 2C show steps of the etching method of the invention which make it possible to form spacers according to FIG. 1B.
Figure 2B:
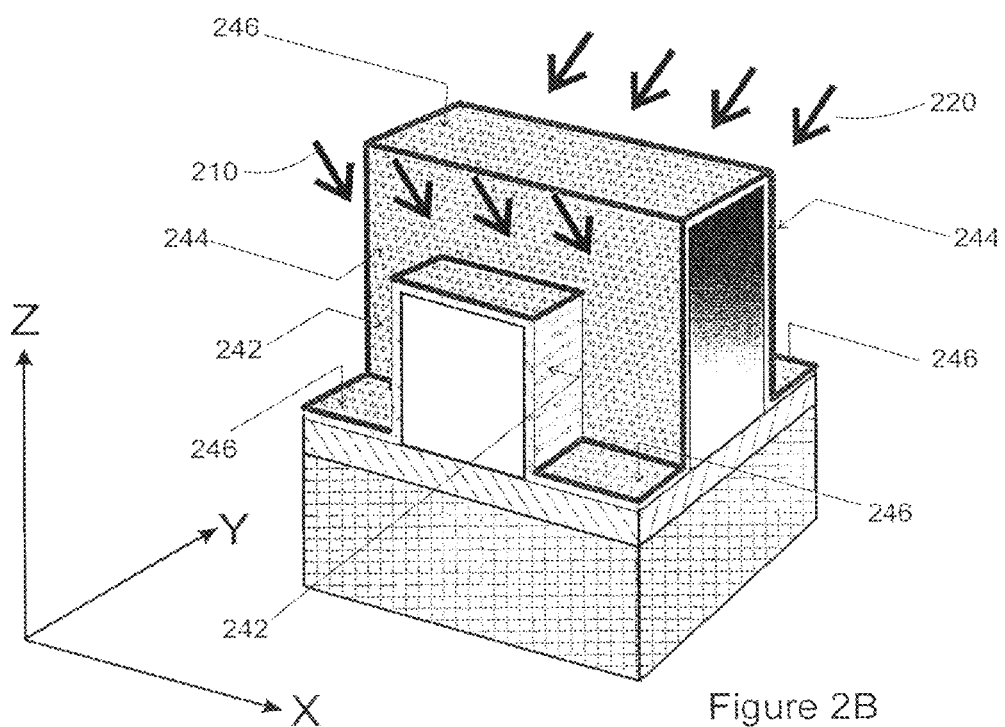
Figure 2C:
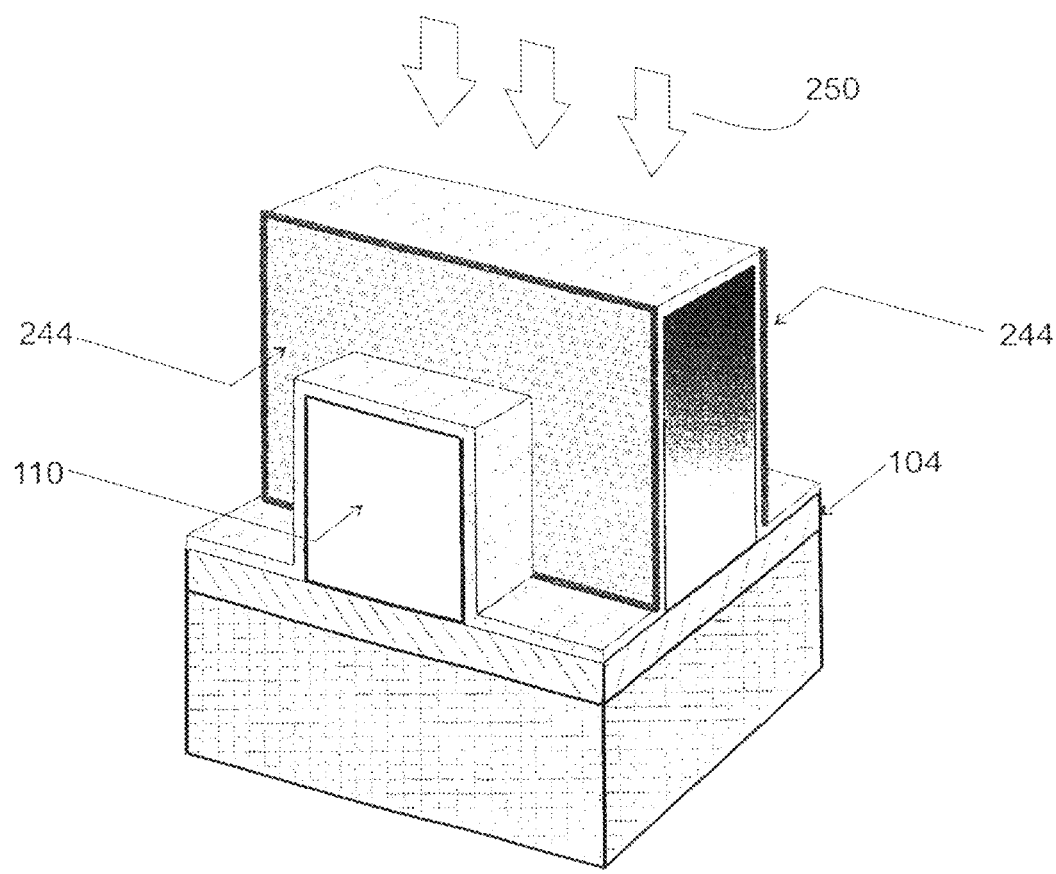

The drawings in FIGS. 2A to 2C illustrate steps of the method of the invention.

As shown in FIG. 2A which is a cross-sectional view of a channel fin, the first step of forming gate spacers consists in executing, preferably in a conventional way, an advantageously conformable and preferably "full plate" deposition, i.e. on all the devices on the surface of the face of the substrate, of the dielectric material which such spacers are made of. This is most generally silicon nitride (SiN). Upon completion of this step, a dielectric layer 240, for instance made of silicon nitride, with a substantially identical thickness along all the orientations of the surfaces whereon it is provided, covers all the devices being produced. The thickness of the deposited layer typically ranges from 5 nm to 30 nm.

As seen in the state of the art, such deposition is performed after forming the FinFET transistors gates, the structure 100 of which may then be the one shown in FIG. 1A.

In such a structure, the dimensions of the "Fin" 110 are typically 5 to 20 nm in width and 20 to 70 nm in height.

FIG. 2B shows the result of the next step, during which the dielectric layer 240 is superficially modified on a part of the surfaces, depending on the orientation thereof. A top layer is thus created at some places. The modification is advantageously carried out using a conventional ion implantation, preferably with (whether exclusively or not) oxygen (O2) ions. Such method thus enables a spatial selectivity in the implantation. The top layer is so configured as not to modify the whole thickness of the dielectric layer 240.

For this purpose, in the implantation equipment, the support of the substrate containing the device(s) being produced is so inclined as to expose the surfaces to be modified, depending on the orientation thereof in space.

In the cases of the figures, at least two implantations 210 and 220, with preferably symmetrical inclinations are executed, during which all the surfaces parallel to the plane of the substrate 246 and a part of the surfaces perpendicular to the plane of the substrate, i.e. those facing the directional flux of ions generated in the implanter, and specifically the surfaces 244, which will eventually form the spacers, will be exposed. The surfaces perpendicular to the plane of the substrate, which are located on either side of the "Fin" 242 and which are not exposed to the ions flux, are not modified. The average direction of the ions flux is advantageously in a plane parallel to the orientation of the second perpendicular surfaces, i.e. the surfaces 242, in the cases of the figures.

The supply of oxygen from the selective implantation of some surfaces causes the oxidation thereof. A part of the dielectric layer, here made of silicon nitride, which was deposited during the preceding step, is converted into a top layer made of silicon nitride (SiO2). Besides, the defects induced into the nitride during the step of implanting may also facilitate the ambient air oxidation thereof, for instance, so that the type of the oxidized surface is then SiOxNy.

The implantation conditions are for instance as follows:

Dose of oxygen ions: within a range of $10^{13}$ to $10^{16}$ atoms per square centimeter ($cm^2$).

Slope of the substrate: from 20 to 80 degrees depending on the geometry of the 3D structures.

Ion energy: within a range from 0.2 keV (kilo electron volt) to 2 keV. The energy to be communicated to the ions depends on the depth of the silicon nitride layer desired to be modified. For example, in order to modify the nitride layer on a depth of 2 to 3 nm, the ions must receive 0.5 keV energy using a dose of $5 \times 10^5$ atoms/$cm^2$.

The executed implantation is directional here, more particularly because of the electrostatic particles acceleration technique. Plasma immersion, which is sometimes used for implanting ions is excluded.

FIG. 2C shows the result of the next step during which the top layer of oxide which has just been formed on all the surfaces parallel to the plane of the substrate is removed. Such operation is performed using anisotropic etching 250 perpendicular to the plane of the substrate, which is executed for instance in preferably argon (Ar), or carbon tetrafluoride (CF4) plasma, and which then etches substantially all the oxidized surfaces parallel to the plane of the substrate. For example, ions energy ranging from 8 to 13 eV and preferably 10 eV may be suitable for such etching. Upon completion of such operation, the surfaces 244 which will eventually form the spacers only remain with an oxidized surface.

Such step creates an opening located in the top surface, so that the underlying dielectric layer 240 is exposed to the outside, at some precisely determined places.

Upon completion of such step, the remaining thickness of dielectric material forming the spacers on all surfaces, whether perpendicular or parallel to the plane of the substrate, which are not, or no longer, protected by the oxide layer, can thus be removed. Such material can thus be removed around the <<Fin>> of the FinFET transistor while leaving the layers 244 located on either side of the gate.

The result is then totally in compliance with what was desired for a FinFET transistor and thus as illustrated in FIG. 1B discussed above.

The remaining layer of the material which the spacers are made of, generally silicon nitride, is preferably removed using isotropic etching, which may be executed in at least two ways, both selective as regards the silicon oxide layer (SiO2) or more generally the underlying SiOxNy layer which supports the structure 100, i.e. the layer 104, and as regards the top oxyde layers of the surfaces 244 which remained in place too.

The parts of the silicon nitride layer which are not protected by oxide may be etched using plasma formed in an etching chamber of the inductive coupling (ICP) type or of the capacitive coupling (CCP) type. For example, in a reactor of the ICP type, the conditions for etching silicon nitride may be as follows: pressure=from 10 to 500 milli Torr; source power=from 100 to 2,000 Watts; pulse of the polarizing source at a frequency of 200 to 5,000 Hz with a duty factor of 10 to 80%. A flow of tetrachlorosilane (SiCl4) is advantageously used during such step.

More precisely, under the following conditions: pressure=80 milli Torr; source power=400 Watts; bias voltage=250 Volts; strokes per minute=500 Hz with a duty factor of 50%; fluoromethane (CH3F) flow=200 cubic centimeter per minute (sccm); oxygen (O2) flow=120 sccm; helium (He) flow=5 sccm; SiCl4 flow=5 sccm; temperature of the substrate holder=60° C.; an etching rate of nitride amounting to 10 nm per minute is obtained.

Etching of the parts of the silicon nitride layer not protected by oxide may also be wet etched, for instance in a phosphoric acid (H3PO4)-based solution, which may be heated between 140 and 180° C. No burning of the silicon oxide layers occurs during such etching of nitride. In a H3PO4 solution heated to 180° C., an etching rate of 4 nm/minute of a film of silicon nitride of the Si3N4 type left in its original state, after deposition in a LPCVD for 21 <<low-pressure chemical vapor deposition>> type reactor can be noted, for instance.

Figure 3:
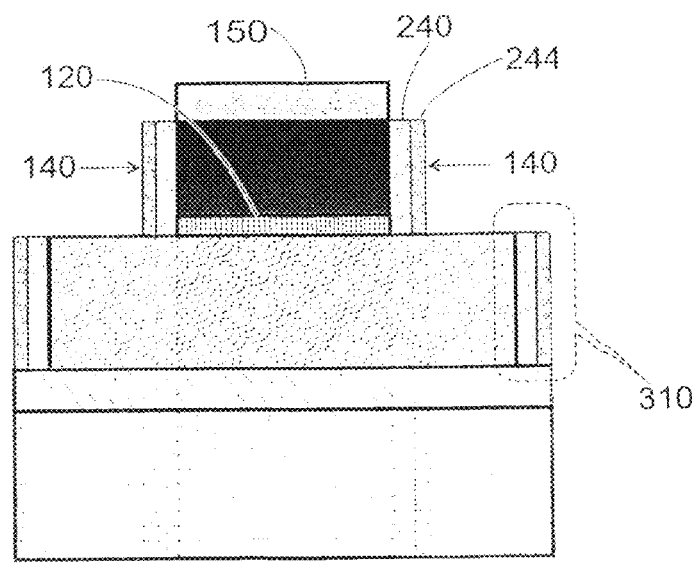
FIG. 3 shows a cross-sectional view of a FinFET transistor produced while using the method of the invention.

FIG. 3 is a cross-sectional view of the structure after etching the unprotected parts of the nitride layer as shown in FIG. 1B. It shows the hard mask 150 mentioned above and the high permittivity dielectric layer 120 which surrounds the <<Fin>> as can be seen in FIG. 1A. Spacers 140 are shown on either side of the gate, which thus consist of two layers: the original nitride layer 240 and the top oxidized layer 244 used as a protection during etching.

It should be noted here that one aspect of the method according to the invention, which is not shown in the previous figures for clarity, and has not been mentioned above, is that spacers layers are also formed in the zone 310 at each end of the <<Fin>> as shown in FIG. 3. Such layers, which have no functionality, do not affect the FinFET structure produced with the method of the invention in any way.

The invention claimed is:

1. A method for etching a dielectric layer located on a surface of a three-dimensional structure formed on a face of a substrate oriented along a plane of the substrate, with said structure comprising surfaces perpendicular to the plane of the substrate and surfaces parallel to the plane of the substrate, with the perpendicular surfaces comprising first flat perpendicular surfaces directed along a first orientation and second flat perpendicular surfaces directed along a second orientation different from the first orientation, said method comprising the following successive steps:

forming a top layer covering the parallel surfaces and the first flat perpendicular surfaces by ionic implantation of at least one ion species into only a part of a thickness of the dielectric layer, with said implantation being configured such that the top layer does not cover the second flat perpendicular surfaces;

partial removing of the top layer configured so as to totally remove the top layer on the parallel surfaces while keeping a residual part of the top layer on the first flat perpendicular surfaces;

selective etching of the dielectric layer relative to a material of the residual part of the top layer and relative to a material of the face of the substrate.

2. The method according to claim 1, wherein the implantation is configured so as to oxidize a material of the dielectric layer.

3. The method according to claim 2, wherein at least dioxygen is the at least one ion species to be implanted.

4. The method according to claim 1, wherein the partial removing of the top layer is a plasma etching.

5. The method according to claim 4, wherein the plasma etching of the partial removing of the top layer is an anisotropic etching configured so as to attack the top layer on the parallel surfaces while not attacking or less attacking the top layer on the first flat perpendicular surfaces.

6. The method according to claim 5, wherein the anisotropic etching is executed with argon plasma or carbon tetrafluoride plasma.

7. The method according to claim 1, wherein the selective etching is executed using plasma.

8. The method according to claim 7, wherein the partial removing and then the selective etching are carried out in the same reactor.

9. The method according to claim 1, wherein the selective etching is a wet etching.

10. The method according to claim 1, wherein the dielectric layer is a nitride layer.

11. The method according to claim 1, wherein the dielectric layer is a low-k material having a dielectric constant smaller than that of silicon nitride.

12. The method according to claim 1, wherein the dielectric layer is conformably deposited onto the face of the substrate and the structure.

13. The method according to claim 12, wherein the ionic implantation is configured so as to form the top layer with a thickness smaller than half the thickness of the dielectric layer.

14. The method according to claim 1, wherein the ionic implantation is configured so as to form the top layer with a thickness ranging from 2 nm to 3 nm.

15. The method according to claim 1, wherein the residual part is used as spacers on flanks of a FinFET type transistor gate.

16. The method according to claim 1, wherein the face of the substrate comprises a surface layer of a semi-conductor material.

17. The method according to claim 1, wherein the first orientation and the second orientation are perpendicular.

18. A micro-electronic device obtained by the method according to claim 1.

* * * * *